(12) United States Patent
Tews et al.

(10) Patent No.: US 8,192,636 B2
(45) Date of Patent: Jun. 5, 2012

(54) COMPOSITION AND METHOD FOR IMPROVED ADHESION OF POLYMERIC MATERIALS TO COPPER ALLOY SURFACES

(75) Inventors: Dirk Tews, Berlin (DE); Christian Sparing, Berlin (DE)

(73) Assignee: Atotech Deutschland GmbH, Berlin (DE)

( * ) Notice: Subject to any disclaimer, the term of this patent is extended or adjusted under 35 U.S.C. 154(b) by 569 days.

(21) Appl. No.: 12/090,990

(22) PCT Filed: Oct. 23, 2006

(86) PCT No.: PCT/EP2006/010201
§ 371 (c)(1),
(2), (4) Date: Sep. 14, 2009

(87) PCT Pub. No.: WO2007/048559
PCT Pub. Date: May 3, 2007

(65) Prior Publication Data
US 2010/0035435 A1 Feb. 11, 2010

(30) Foreign Application Priority Data
Oct. 25, 2005 (EP) .................................. 05023278

(51) Int. Cl.
*H01L 21/306* (2006.01)
*C09K 13/00* (2006.01)
(52) U.S. Cl. ......... 216/13; 216/106; 438/754; 252/79.1; 257/E21.219
(58) Field of Classification Search .................. None
See application file for complete search history.

(56) References Cited

U.S. PATENT DOCUMENTS

| | | | |
|---|---|---|---|
| 4,374,744 A | 2/1983 | Kawanabe et al. | |
| 4,921,571 A | 5/1990 | Kukanskis et al. | |
| 5,244,539 A | 9/1993 | McGrath et al. | |
| 5,505,872 A | 4/1996 | Krulik et al. | |
| 5,512,201 A | 4/1996 | Singh et al. | |
| 5,741,432 A | 4/1998 | Wong | |
| 5,807,493 A | 9/1998 | Maki et al. | |
| 5,965,036 A | 10/1999 | Maki et al. | |
| 5,989,449 A | 11/1999 | Campbell | |
| 2005/0072524 A1* | 4/2005 | Mueller et al. ........... 156/345.11 | |
| 2005/0126588 A1 | 6/2005 | Carter et al. | |
| 2005/0178742 A1 | 8/2005 | Chelle et al. | |

FOREIGN PATENT DOCUMENTS

| | | |
|---|---|---|
| DE | 4118764 | 12/1992 |
| EP | 0791671 | 2/1997 |
| EP | 0826793 | 3/1998 |
| EP | 0855454 | 9/2002 |
| GB | 1154015 | 6/1969 |

(Continued)

OTHER PUBLICATIONS

International Search Report, Apr. 13, 2007.
(Continued)

*Primary Examiner* — Allan Olsen
(74) *Attorney, Agent, or Firm* — McDonnell Boehnen Hulbert & Berghoff LLP

(57) ABSTRACT

The present invention relates to a method for treating copper or copper alloy surfaces for tight bonding to polymeric substrates, for example solder masks found in multilayer printed circuit boards. The substrate generally is a semiconductor-device, a lead frame or a printed circuit board.

14 Claims, 4 Drawing Sheets

FOREIGN PATENT DOCUMENTS

| | | |
|---|---|---|
| JP | 53030435 | 3/1978 |
| JP | 9-41162 A | 2/1997 |
| JP | 2000-282265 | 10/2000 |
| WO | 98/33951 | 8/1998 |

OTHER PUBLICATIONS

Written Opinion of the International Searching Authority, Apr. 13, 2007.

International Preliminary Report on Patentability, Feb. 1, 2008.

* cited by examiner

Figure 1: SEM Picture Magnification 10.000x of Example 3, Table 1
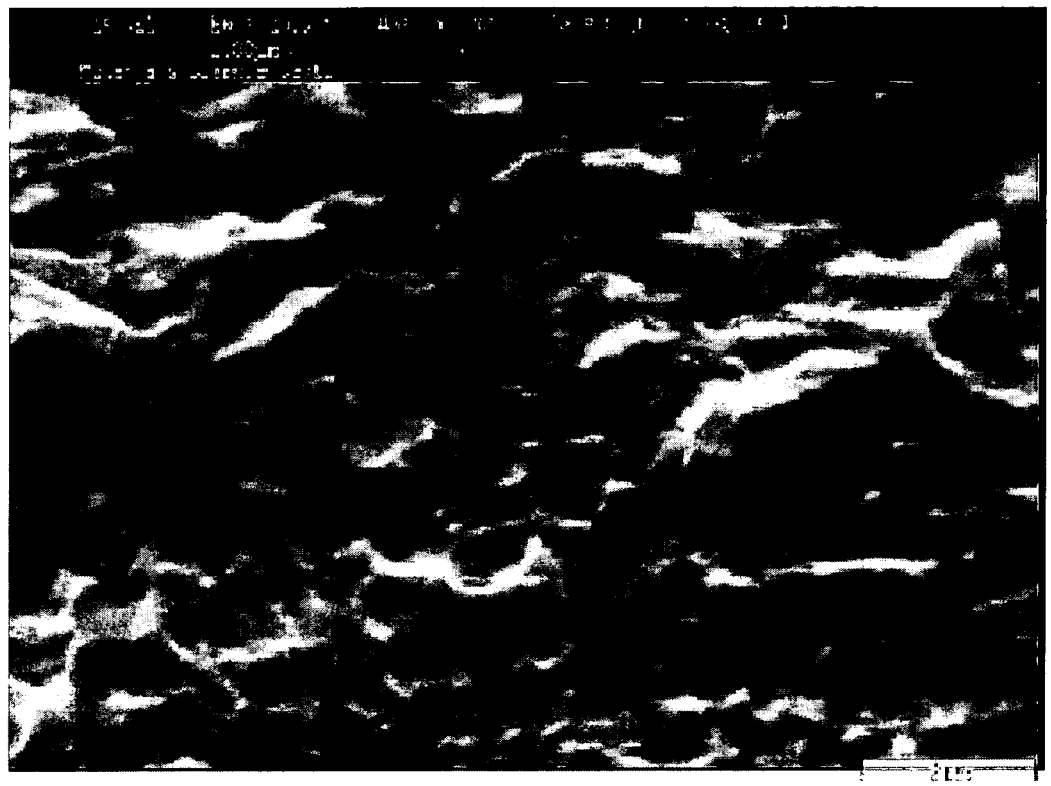

Figure 2: AFM Investigation of Example 3, Table 1
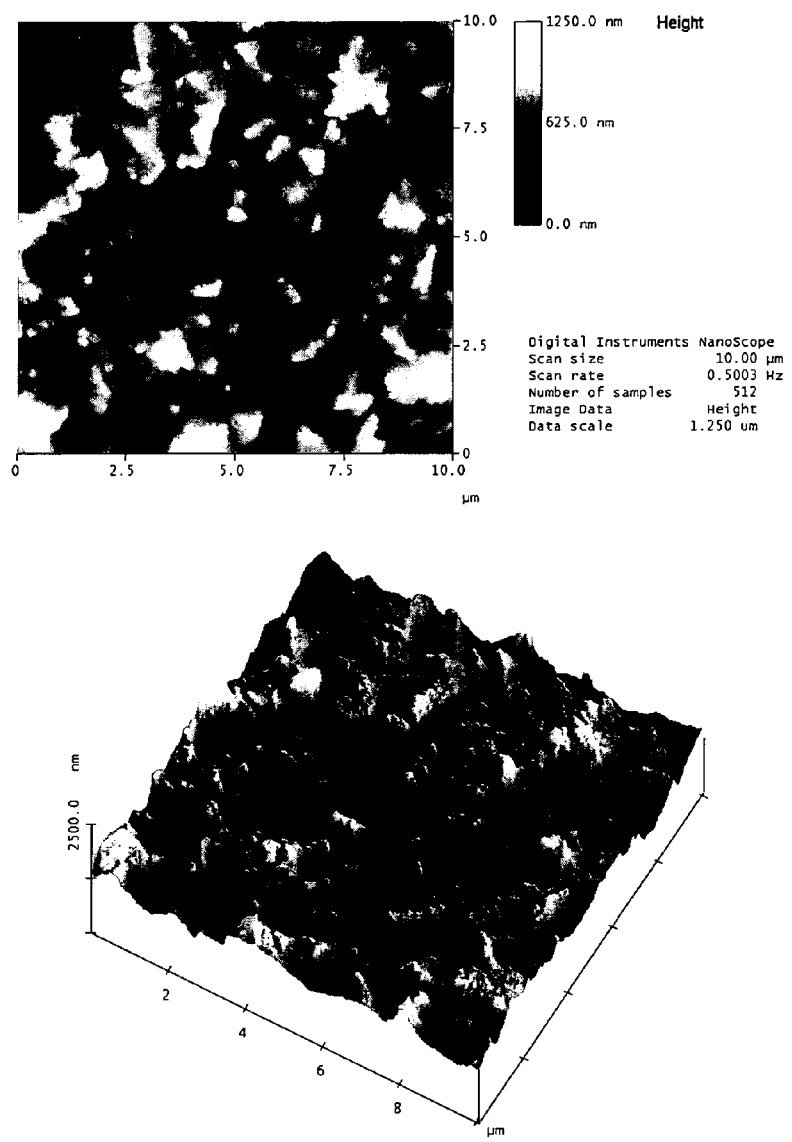
Average roughness values: RMS = 164 nm, Ra = 132 nm, Rmax = 1,157 µm, RSAI = 41,9 %.

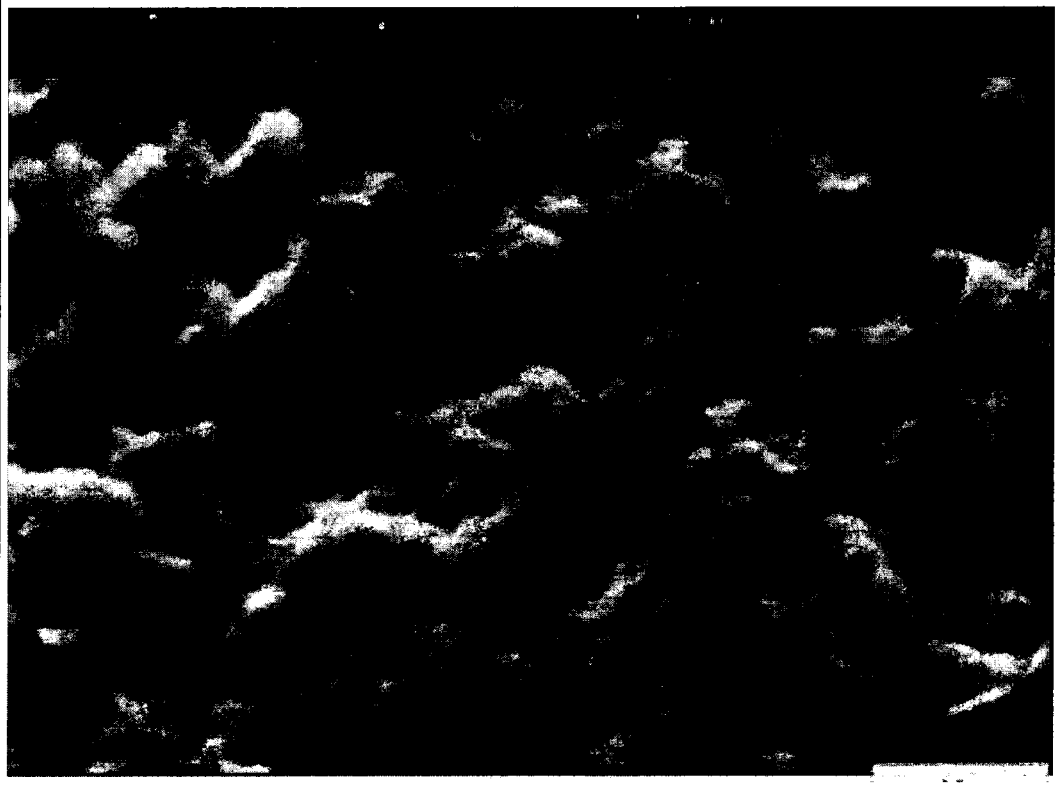
Figure 3: SEM Picture Magnification 10000x of Example 4, Table 1

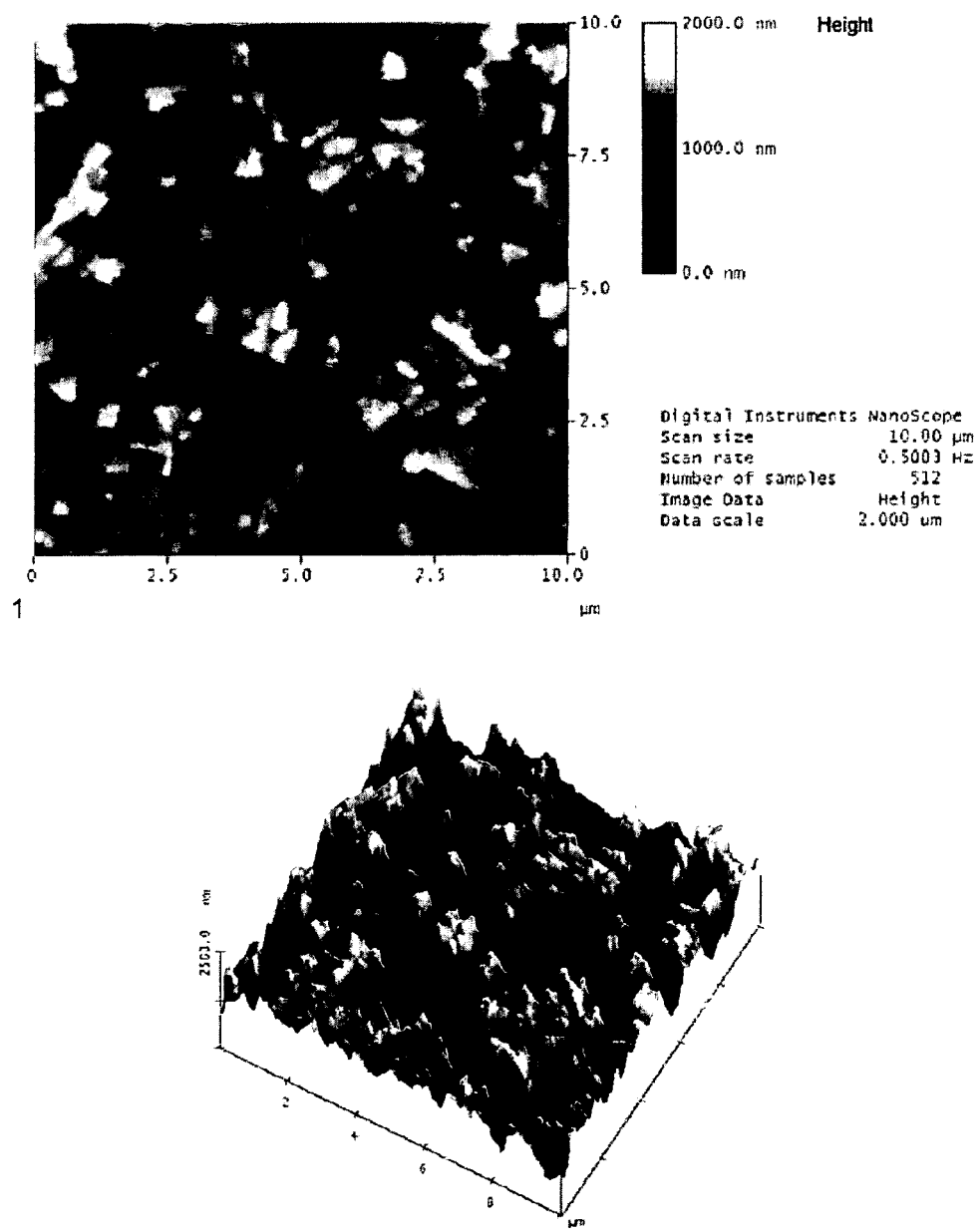
Figure 4: AFM Investigation of Example 4, Table 1
Average roughness values:
RMS = 342 nm, Ra = 289 nm, Rmax = 1,878 μm, RSAI = 101,7 %.

COMPOSITION AND METHOD FOR IMPROVED ADHESION OF POLYMERIC MATERIALS TO COPPER ALLOY SURFACES

This application is a national phase application under 35 U.S.C. 371 of International Application No. PCT/EP2006/010201, filed Oct. 23, 2006, which claims priority to EP 05023278.4, filed Oct. 25, 2005, the contents of which are hereby incorporated by reference for any purpose.

DESCRIPTION OF THE INVENTION

The present invention relates to a method for treating copper or copper alloy surfaces for tight bonding to polymeric substrates, for example solder masks found in multilayer printed circuit boards. The substrate generally is a semiconductor-device, a lead frame or a printed circuit board.

BACKGROUND OF THE INVENTION

In manufacturing substrates like printed circuit boards, various steps are carried out in which copper or copper alloy surfaces must be tightly bonded to a polymeric substrate. In some cases, the required adhesion of the formed bonds must be ensured over a long period. In other cases, a tight bond only has to exist for a short period, e.g. when the polymeric substrate only remains on the copper or copper alloy surfaces during manufacture of the printed circuit board. For example, the tight bond of dry film resists (for structuring conductor lines on printed circuit boards) to the copper surfaces only has to exist while manufacturing the printed circuit board. After the conductor line structures are formed, the resists can be removed.

Another application are solder masks, which are applied to a printed circuit board in order to retain a solderable surface on the board surface. Optimum solder mask resist performance can be only achieved if the printed circuit board surface is properly prepared prior to the application of the solder mask. The solder mask is designed to insulate and protect the copper traces of the printed circuit and keep them from shorting together during wave soldering or reflow soldering. In other words an insulating pattern is applied to a printed circuit board that exposes only the areas to be soldered.

Solder mask options have changed radically in recent years, driven by the demands of surface mount assemblies, as well as environmental concerns, e.g. lead-free solder condition.

With the advent of surface mounting and the introduction of fine pitch components, the requirements for the solder mask application have increased considerably. Due to the increasing complexity of the board circuitry (i.e. finer lines/spaces ratio) and the use of more selective finish techniques, proper adhesion of the solder mask has become a critical issue. Similarly, to withstand the thermal stress encountered during subsequent process steps, better adhesion of the solder mask is required.

Commonly used mechanical pre-treatment processes like mechanical brushing or pumice do not match the desired criteria for optimum solder mask adhesion pre-treatment. Mechanical brushing cannot clean holes and leads to a directional finish often associated with a mechanical deformation. Whereas a pumice pre-treatment can cause residues on the copper surface and makes the rinsing critical in tight geometries.

As a consequence, the need for chemical etching solutions as a pre-treatment step before application of polymeric materials like solder masks has increased during recent years.

Generally, it is a challenge to provide chemical etching solutions to treat copper or copper alloy surfaces which only roughen the surface, but do not excessively etch away the copper layers. Several etching solutions have been developed to meet this need, but exhibit various disadvantages.

Conventional and established treatment methods make use of sodium persulfate or hydrogen peroxide based etching solutions for copper surfaces. These solutions result in uniformly etched the copper surfaces, however only marginally increase the etched surface area. Generally, the lower the increase in surface area is, the poorer the adhesion properties of the subsequently formed bond between the metal and the polymeric substrate are.

Therefore, such conventional etch composition do not yield etch results sufficient for fine line technology. This applies particularly to fine line high-density interconnect (HDI) feature on printed circuit board sizes of 50 μm and today even 25 μm or lower. The sizes particular relate to the L/S value. The L/S value determines the width of a conductor track (L) and the space (S) between two conductor tracks. Fine line applications are typically described by L/S-values of 50 μm or lower for the L and S-value, more particular 25 μm or lower for the L and S-value. In order to enable fine line technology the need for having a resolution with semi aqueous developable solder masks below 125 μm is increasing.

Solder masks applied to such pre-treated copper surfaces show insufficient adhesion to the copper surface.

U.S. Pat. No. 5,807,493 discloses a micro etching solution for copper or copper alloys containing a cupric ion source, an organic acid, a halide ion source and water resulting in adhesion improvement of resins or polymers on copper or copper alloy surfaces.

EP 0855454 B 1 relates to a micro etching solution for copper or copper alloys comprising and oxidizing agent which is a cupric ion or ferric ion source, a polymer compound which contains polyamine chains or cationic group, water and a halide ion source. A micro roughened metal surface is gained by applying this process.

The use of cupric ions like cupric chloride, however, has some disadvantages. The use of cupric ions is expensive and the etch rate achieved is not sufficient for all applications desired for such process. If ferric salts like ferric chloride is used as the etch ingredient, unwanted precipitation and sludge formation of ferric ion compounds is often a problem, particularly when working at high ferric ion concentrations.

Therefore, it is an object of the present invention to provide a method for an efficient pretreatment of copper or copper alloys creating a tight bond between the copper surfaces and polymer surfaces applied thereto and avoiding the disadvantages of the state of the art.

The process should be simple, easy to use, have a high etch rate, be inexpensive and creating no problems in the subsequent processing steps of the substrate, particularly a printed circuit board.

This problem is solved by applying a solution to treat copper or copper alloy surfaces so that a tight bond can be subsequently formed between the copper or copper alloy surfaces and polymeric substrates by contacting the copper surfaces with a solution comprising:
  (i) a ferric ion source
  (ii) a buffer of an organic acid and an organic acid salt
  (iii) a halide ion source
  (iv) an accelerator The method according to this invention is carried out by contacting the copper or copper alloy surfaces with aforementioned solution. The substrate can be immersed into the solution or the solution can be sprayed onto the copper or copper alloy surface of the substrate. For this purpose common horizontal or vertical equipment can be utilized.

Using a spray, the solution is sprayed onto the substrate having a copper or copper alloy surface at a pressure of 1-10 bar.

For both methods (spray or solution) the process is preferably carried out at a temperature of 20-60° C. The treatment time can vary between 15 and 300 s.

The preferable ranges of the ingredients in the solution are:

| Ferric ions | 1-50 g/l, more preferred 3-15 g/l |
|---|---|
| Buffer | 10-200 g/l |
| Halide ion | 1-100 g/l |
| Accelerator | 0.5-30 g/l, more preferred 1-10 g/l |

Ferric ion sources can be ferric salts of inorganic acids such as ferric chloride, ferric nitrate, ferric sulfate, ferric bromide. Salts of organic acids such as ferric acetate and solutions such as ferric hydroxide may also be applied. Two or more ferric ion sources may be used together. The amount of the ferric compounds in terms of the content of metal ions is in the range of 1-50 g/l, preferably 3-15 g/l.

The etching solution according to the invention operates at a fairly low ferric ion content. The low ferric ion concentration results in a moderate etch rate, yielding the desired roughness properties while avoiding excessive etching of the copper or copper alloy from the substrate.

Buffer solutions applied in the current invention contain an organic acid and its corresponding salt, preferably its sodium salt. The amount of the acids is preferably in the range of 1-200 μl, more preferred 1-50 g/l, the amount of the corresponding salt preferably in the range of 1-200 g/l, more preferred 1-50 g/l. In order to achieve a good buffer capacity the ratio of the acid to the salt should range between 10:1 to 1:1. Examples for buffer solutions comprise formic acid/sodium formiate, tartaric acid/potassium-sodium tartrate, citric acid/sodium citrate, acetic acid/sodium acetate and oxalic acid/sodium oxalate and mixtures thereof.

The etching solution further contains an accelerator selected from the group consisting of urea, thiourea, guanidinium salts, sulfosalicylic acid, niacinamide and amino acids like glycine, alanine, valine, leucine, iso-leucine and cystein. Furthermore, triazoles, benzotriazoles, imidazoles, benzimidazole, tetrazoles and isocyanates can be used as accelerators.

The accelerators not only increase the etch rate and surface roughness, but also prevent smudge or residue formation on the substrate. The amount of the accelerator preferably ranges between 0.5-30 g/l. The buffer in combination with the accelerator does not only influence the etch rate, but furthermore greatly enhances the surface roughness of the treated copper or copper alloy substrate. It is believed that the accelerator compound absorbs onto the copper surface, thus influencing the etch rate on a sub-micron scale. This causes the imparted roughness to be several times greater than without such accelerator. The accelerator also directs the etching process to the copper or copper alloy grain boundaries, resulting in greatly increased etching on the boundaries compared to the etch rate away from these grain boundaries. This effect further increases the surface roughness achieved, which is much greater than expected for ferric ion solutions. This effect is surprising.

The etching solution according to the present invention results in better roughness values and adhesion properties of the polymeric materials to the copper or copper alloys as for example with those described in EP 0 855 454. This better etching effect is particularly remarkable for the etching of the grain boundaries and so result in deeper crevices in the etched surface.

The halide ions are selected from the group consisting of chloride, bromide and fluoride. Chloride is most preferred. The amount of halide ions added preferably ranges from 0.5-100 μl, more preferred 1-20 g/l.

Optionally, the solution can additionally contain a complexing agent for ferric ions. They are particularly useful when the concentration of the ferric ions in the etching solution is at the higher end of the preferred ranged, i.e. higher than 20 g/l.

The etching solution is free of a polymer compound which contains polyamine chains or a cationic group or both as described in EP 0 855 454, the concentration of which is difficult to control in industrial etching processes.

The chemical composition of the etching solution is maintained at a "steady state" (i.e. approximately constant copper ion concentration) during operation by employing "feed-and-bleed" replenishment. At the beginning of the etch process, the solution is virtually free of copper ions. Upon applying the etch composition, copper ions are dissolved from the metal substrate resulting in an increase in copper ions in the solution. It is necessary to maintain the copper ion concentration constant in order to ensure a reliable etching process of the surface. Therefore, a part of the etching solution is taken out of the process (bleed) and replaced with fresh etching solution (feed). The amount of etching solution to be replenished depends on the copper content and can be calculated according to the following equation:

C (g/l): Cu concentration at steady state
B (in l/m² Cu surface): bleed rate
D (etch amount of Cu in g/m²): Dissolution of Cu by etch reaction $$B = \frac{D}{C}$$

The etch reaction is represented by the following equation:

$$Fe(III)Cl_3 + Cu \rightarrow Fe(II)Cl_2 + Cu(I)Cl$$

The copper ion concentration can be kept constant at a desired concentration by the before mentioned feed-and-bleed technology. In order to make the process cost efficient it is recommended to keep the copper ion concentration between 5 and 60 g/l, preferably 20-40 g/l. At this concentration the copper ions have no negative effect on the etching result.

Since the etching solution of the invention is typically applied to the substrate as a spray, the ferric ions reduced to ferrous ions upon dissolving of the copper will be reoxidised by oxygen from the air. Therefore, the amount of ferric ions to be replenished is equal to the amount of ferric ions which are dragged out resulting in a cheap replenishment.

$$4Fe(II) + O_2 + 4H^{\oplus} \rightarrow 4Fe(III) + 2H_2O$$

During this reaction protons are consumed in order to oxidize the ferrous (Fe-II) ions back to ferric (Fe-III) ions. The buffer applied in the etching solution maintain the pH-value within the desired range during operation. This ensures a constant etch rate. Generally, the lower the pH-value, the faster the etch rate or copper dissolution rate is. The concentration of the buffer system is adjusted as such that an etch rate appropriate for vertical or horizontal pre-treatment equipments is achieved. Upon choosing the concentrations given before, this aim is achieved. Standard tests (etch rates vs. buffer concentration) may be applied for different systems in order to determine the optimum etch rate. These experiments are common in industry and performed on a routine basis.

After the copper or copper alloy surface has been treated as such, the copper or copper alloy surfaces are rinsed with water, e.g. deionised water and then dried, e.g. with hot air.

Optionally, the etched copper or copper alloy surfaces can also be treated for 5-300 seconds with diluted acid after being rinsed, preferably with 10 weight % hydrochloric acid. After being treated with acid, the copper surfaces are again rinsed, preferably with deionised water.

The samples are preferably treated by spraying the etching solution according to the invention onto the samples. The solution can be sprayed in a vertical mode or horizontal mode, depending on the equipment desired. Alternatively, the samples can be immersed into the etching solutions. To achieve the same roughness values compared to spraying, the solution needs to be penetrated by oxygen, e.g. by bubbling air through it.

The etching solution of the invention also has the advantage to be compatible with commonly used solder masks and selective finish techniques, e.g. hot air solder level (HASL), immersion silver, electroless nickel gold (ENIG) and immersion tin.

To illustrate the broad scope of this invention, ENIG and immersion tin are selected for sample preparation as selective finishes. The immersion of printed circuit boards into an electroless nickel gold process requires and excellent adhesion of the solder mask on the copper surface due to the relatively long treatment times and high process temperatures.

The inevitable hydrogen evolution is also critical for solder mask adhesion. When applying immersion tin baths at higher temperatures, which generally contain thiourea and acids, attack of the bond between the solder mask and the copper surface is likely to occur. The better the adhesion properties between the solder mask and the copper, the less likely such an attack is.

EXAMPLES

After roughening the samples with the solution according to the invention (see Table 1 for details) they were coated with a solder mask. An Elpemer SD 2467 DG solder mask was applied with a semi-automatic screen printer. The coated samples were pre-cured for 40 minutes at 80° C.

A test pattern (Test Coupon G of IPC-2221) was created by using a UV exposure (Stouffer Step 11-12) followed by an aqueous alkaline image development in a 1% sodium carbonate solution at 30° C. in a spray module.

The test samples were rinsed with city water and finally rinsed with DI water. Afterwards the panels were dried and the final cure was done at 150° C. for 60 minutes. After the final cure the test samples were cut in half and treated either in an immersion tin process for 10 min at 65° C. (commercially available Stannatech process from Atotech Deutschland GmbH) or an electroless nickel-gold process (commercially available Aurotech process from Atotech Deutschland GmbH) consisting of an electroless nickel plating for 20 min at 80° C. and an immersion gold plating for 8 min at 85° C. After 1 hour holding time, the adhesion of the solder mask on the roughened copper surface was tested by making a tape test in relation to IPC TM-650 Number 2.4.28.1. The results are given in Table 1.

The following samples were made according to the previous described process sequence in order to illustrate the invention. Test solutions were prepared according to the composition shown in Table 1. After etching test coupons were processed with the process sequence as described before. The results after tape test are shown in Table 1. Only adhesion values between the solder mask on the copper surfaces are considered suitable which pass both final finish applications ENIG and immersion tin. For such treated samples the adhesion between the solder mask and the copper surface is strong enough to be considered universally applicable.

Example 1 and example 2 contain a buffer system and a halide ion source. According to the tape test result, the copper surface roughness achieved does not provide a sufficient adhesion of the solder mask for both ENIG- and immersion tin-finish techniques. Example 2 showed an improvement compared to example 1 by changing the halide ion source from hydrochloric acid to sodium chloride. These two pre-treatment solutions would not be considered suitable for solder mask applications.

Example 3 contains a different buffer composition resulting in a more roughened copper surface shown in FIG. 1 (SEM) and FIG. 2 (AFM) by the following values: RSAI value (roughness surface area increase)=41.9%, RMS (root mean square value of depths of etched crevices)=164 nm, Ra (average roughness value)=132 nm and Rmax=1157 nm. However, example 3 did only pass the tape test after ENIG, not after immersion tin. Therefore, it would not be considered suitable for the application of the present invention.

Example 4 shows that the etch rate and the roughness values achieved can be further improved by the applying an accelerator (guadinium nitrate) within the etching solution. The roughened copper surface resulting from treating a sample according to example 4 is shown in FIG. 3 (SEM) and FIG. 4 (AFM). FIG. 4 shows very good surface roughness parameters: RMS (root mean square value of depths of etched crevices)=342 nm, Ra (average roughness value)=289 nm, Rmax=1878 nm. The surface increase is 107.7% (RSAI, roughness surface area increase), an excellent value. Generally, for solder mask applications, RSAI values of higher than 60% are required. For other application the present invention is suitable for, RSAI values of higher than 45% are often sufficient.

TABLE 1

|  | Component | wt. % | Tape Test results after Selective Finish ENIG/Tin | Copper surface appearance | Etch depth [μm] 30 s/60 s |
|---|---|---|---|---|---|
| Example 1 (comparative) | Ferric chloride | 1.2 | Failed/ Failed | Less rough Dark appearance | 2.2/4.4 |
|  | Citric acid | 12 |  |  |  |
|  | Sodium citrate | 15 |  |  |  |
|  | HCl (32%) | 4 |  |  |  |
|  | DI water | 67.8 |  |  |  |

TABLE 1-continued

| | Component | wt. % | Tape Test results after Selective Finish ENIG/Tin | Copper surface appearance | Etch depth [μm] 30 s/60 s |
|---|---|---|---|---|---|
| Example 2 (comparative) | Ferric chloride | 1.2 | Passed/ Failed | Rough Salmon pink | 2.0/4.0 |
| | Citric acid | 12 | | | |
| | Sodium citrate | 15 | | | |
| | NaCl | 5 | | | |
| | DI water | 66.8 | | | |
| Example 3 (comparative) | Ferric chloride | 1.2 | Passed/ Failed | Rough Salmon pink | 0.8/1.7 |
| | Gluconic acid | 10 | | | |
| | Sodiumgluconate | 15 | | | |
| | NaCl | 1 | | | |
| | DI water | 72.8 | | | |
| Example 4 | Ferric chloride | 1.2 | Passed/ Passed | Rough Salmon pink | 1.4/2.8 |
| | Gluconic acid | 10 | | | |
| | Sodiumgluconate | 15 | | | |
| | NaCl | 1 | | | |
| | Guanidinium nitrate | 0.5 | | | |
| | DI water | 73.5 | | | |

We claim:

1. A method of applying a polymeric material to a copper or copper alloy surface, which method comprises:
   (a) treating the copper or copper alloy surface with an etching solution comprising:
      (i) a ferric ion source;
      (ii) a buffer of an organic acid and its corresponding salt;
      (iii) a halide ion source; and
      (iv) an accelerator;
   wherein the accelerator is selected from the group consisting of urea, thiourea, guanidinium salts, sulfosalicylic acid, niacinamide, cyanates, thiocyanates, triazoles, benzotriazoles, imidazoles, benzimidazoles, tetrazoles, isocyanates and amino acids and wherein the ferric ion concentration is in the range of 1-50 g/l; and
   (b) applying the polymeric material to the treated copper or copper alloy surface.

2. A method according to claim 1 wherein the ferric ion source is selected from the group consisting of ferric chloride, ferric nitrate, ferric sulfate, ferric bromide, ferric acetate, and ferric hydroxide.

3. A method according to claim 1 wherein the buffer is selected from the group consisting of formic acid/sodium formate, tartaric acid/ potassium-sodium tartrate, citric acid/ sodium citrate, acetic acid/sodium acetate, oxalic acid/sodium oxalate, and gluconic acid/sodium gluconate.

4. A method according to claim 1 wherein the buffer concentration is in the range of 1-200 g/l for the acid and of 1-200 g/l for its corresponding salt.

5. A method according to claim 1 wherein the accelerator concentration is in the range of 0.5-30 g/l.

6. A method according to claim 1 wherein the halide ion concentration is in the range of 1-20 g/l.

7. A method according to claim 1 wherein the treatment time is between 15 and 300 s.

8. A method according to claim 1 wherein the copper ion concentration is maintained constant in a range between 5-60 g/l $Cu^{2+}$ by taking a part of the etching solution out of the process (bleed) and replaced it by fresh etching solution (feed) and whereby the amount of etching solution to be replenished is calculated according to the following equation:

$$B = \frac{D}{C}$$

wherein
C is the $Cu^{2+}$ concentration in the steady state in g/l;
B is the bleed rate in $1/m^2$ $Cu^{2+}$ surface; and
D (etch amount of Cu in $g/m^2$): Dissolution of Cu by etching reaction.

9. The method of claim 1 wherein the polymeric material is a solder mask.

10. The method of claim 1 wherein the ploymeric material is a dry film resist.

11. A method according to claim 1 wherein the temperature is between 20-60° C.

12. A method according to the claim 11 wherein the solution is sprayed onto the substrate having a copper or copper alloy surface at a pressure of 1-10 bar.

13. The method of claim 1 wherein the copper or copper alloy surface is rinsed after the treatment of step (a) and before the application of polymeric material of step (b).

14. The method of claim 13 wherein said rinse step includes a rinse with diluted acid.

* * * * *